United States Patent [19]

Bailey

[11] Patent Number: 5,777,518
[45] Date of Patent: Jul. 7, 1998

[54] METHOD OF BIASING MOSFET AMPLIFIERS FOR CONSTANT TRANSCONDUCTANCE

[75] Inventor: James A. Bailey, Allentown, Pa.

[73] Assignee: Lucent Technologies Inc., Murray Hill, N.J.

[21] Appl. No.: 741,067

[22] Filed: Oct. 30, 1996

[51] Int. Cl.$^6$ ............................................. H03F 1/30
[52] U.S. Cl. ...................... 330/296; 330/277; 330/289
[58] Field of Search ............................. 330/277, 289, 330/296

[56] References Cited

U.S. PATENT DOCUMENTS 4,484,089  11/1984  Viswanathan .
4,697,153  9/1987  Lish ................................... 330/296 X

OTHER PUBLICATIONS

P. Siniscalchi et al.,"High–Precision, Programmable, 1–10 MHz Bandwidth, 0–20dB Gain Communication Channel", IEEE 1996 Custom Integrated Circuits Conference, p. 87.

Course notes—"Practical Aspects of Analog and Mixed–Mode IC Design", pp. 19–21 (John/Martin 1995).

Primary Examiner—James B. Mullins

[57] ABSTRACT

A MOSFET amplifier device is biased to exhibit a substantially constant transconductance over a range of variations in power supply, temperature and process. A bias circuit includes a pair of MOS field effect devices, one of which is biased in a triode operating region with a constant reference drain-to-source terminal voltage and with a constant first reference drain-to-source terminal current. The other field effect device is biased in saturation by a circuit that derives a gate-to-source terminal bias voltage from the gate terminal voltage of the first device and the first reference voltage. A second reference current flows into the drain terminal of the second device, and a corresponding bias current is derived, for example, by mirroring the second reference current. The mirrored reference current is used to bias a MOS amplifier device, to maintain a substantially constant transconductance over the mentioned range of variations.

12 Claims, 2 Drawing Sheets

METHOD OF BIASING MOSFET AMPLIFIERS FOR CONSTANT TRANSCONDUCTANCE

BACKGROUND OF THE INVENTION

1. Field of the Invention

The present invention relates to techniques for stabilization of transconductance of MOSFET amplifier devices.

2. Discussion of the Known Art

The transconductance or $g_m$ of a MOSFET amplifier is a measure of the rate of change in amplifier drain-to-source current with respect to its gate-to-source voltage. Typically, the transconductance of a MOSFET amplifier is a function of its DC bias current, $I_D$.

It is known to bias MOSFET operational amplifiers with currents that are proportional to absolute temperature (PTAT), to compensate for a reduction of transconductance with respect to increasing temperature. See P. Siniscalchi, et al, High-Precision, Programmable 1-10 MHZ Bandwidth, 0-20 dB Gain Communication Channel, IEEE 1996 Custom Integrated Circuits Conference, at 85, 87.

U.S. Pat. 4,484,089 (Nov. 20, 1984) discloses a switched-capacitor arrangement for conductance control of variable conductance elements. According to the patent, the transconductance of a MOSFET amplifier device is matched to an effective conductance $C_1/T$ of a capacitor $C_1$ that is switched at a clock rate of 1/T.

Also known is a transconductance regulation circuit which requires an external resistor. In such a circuit, the transconductance of a MOSFET is made to be a function of the conductance of the external resistor and FET channel geometric ratios only.

A problem with the known techniques for stabilizing amplifier transconductance, is that they require external components such as a resistor or a capacitor. The known stabilization techniques may also require a source of digital clock signals thus imposing a need to filter the output of the stabilization circuit. A need therefore exists for a transconductance stabilization technique that requires no external components or clock signals, in order for it to be implemented reliably on-chip with the stabilized amplifier device.

SUMMARY OF THE INVENTION

According to the invention, a method of biasing an amplifier device to obtain a constant transconductance, comprises operating a first field effect device with source, drain and gate terminals in a triode operating region, operating a second field effect device with source, drain and gate terminals in a saturation region, deriving a first reference voltage source, and deriving a first reference current source. The first field effect device is biased with first circuit means responsive to the first reference voltage so that a voltage measured between the drain and the source terminals of the field effect device is substantially equal to the first reference voltage while the first reference current is applied to the drain terminal of the device. The method also calls for biasing the second field effect device with second circuit means to obtain a gate-to-source terminal voltage on the second device, which voltage is derived from a voltage at the gate terminal of the first field effect device and the first reference voltage, such that a second reference current flows into the drain terminal of the second field effect device. An amplifier bias current is derived according to the second reference current in the second field effect device, for biasing an amplifier device to maintain substantially constant transconductance over a range of ambient operating conditions.

For a better understanding of the invention, reference is made to the following description taken in conjunction with the accompanying drawing, and the scope of the invention will be pointed out in the appended claims.

DETAILED DESCRIPTION OF THE INVENTION

Figure 1:
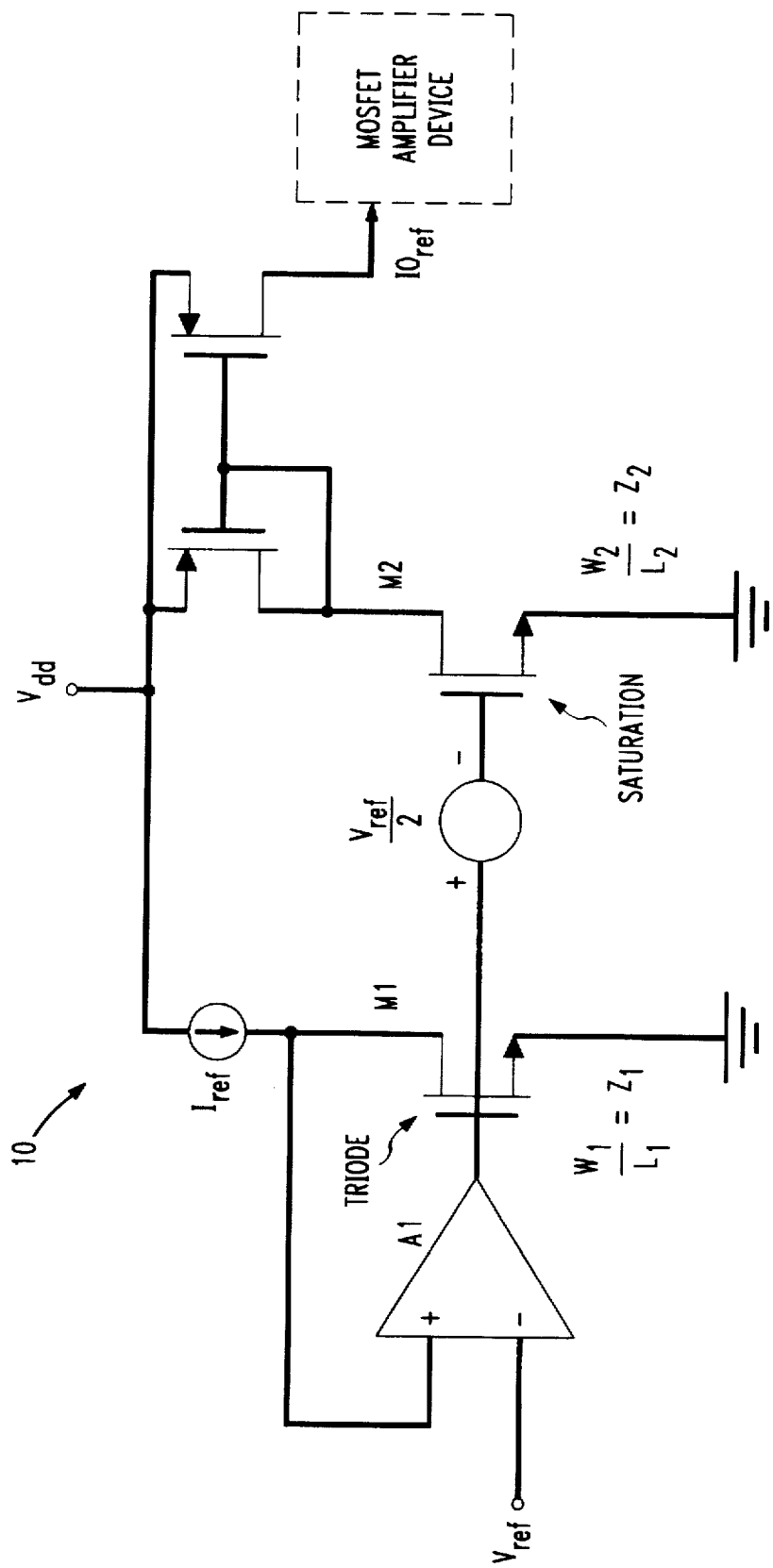
FIG. 1 is an electrical schematic diagram of a first embodiment of a bias circuit, according to the invention.

FIG. 1 is a schematic diagram of a first embodiment of an amplifier bias current circuit 10, according to the invention.

Assume that accurate sources of reference voltage (Vref) and current (Iref) are available on-chip. The circuit 10 can be used for producing an output reference current (IOref) for biasing amplifiers on a common chip at a constant transconductance, largely independent of variations in power supply, temperature, and process. Process variations include, for example, oxide thickness on a chip substrate, and variations in device channel length and width.

MOS field effect device M1 has a certain width and length (W1/L1). $V_{ref}$ and $I_{ref}$ are chosen such that device M1 is biased in the triode operating region over a known range of variations in supply, process and temperature, that is, over a certain range of ambient operating conditions. MOS field effect device M2 has a width and length (W2/L2) chosen such that device M2 will always be biased in saturation.

The drain current in device M1 is:

$$I_{d1} = I_{ref} = kZ_1[(V_{gs} - V_T)V_{ds}/2] \quad (1)$$

wherein:

k′=mobility times oxide capacitance or $\mu C_{ox}$
$Z_1 = W1/L1$
$V_T$=threshold voltage Operational amplifier A1 adjusts the gate-to-source terminal voltage on device M1 such that $V_{ds}$, for M1=$V_{ref}I_{d1}$ can then be rewritten:

$$I_{d1}I_{ref} = kZ_1[(V_{gs} - V_T)V_{ref} - V^2_{ref}/2] \quad (2)$$

Solving eq. (2) for $V_{gs} - V_T$:

$$V_{gs} - V_T = (I_{ref}/kZ_1 + V^2_{ref}/2)/V_{ref} = \quad (3)$$
$$= i_{ref}/V_{ref}kZ_1 + V_{ref}/2$$

The gate-to-source voltage on device M2 is therefore:

$$V_{gsM2} = i_{ref}/V_{ref}kZ_1 + V_T \quad (4)$$

Because device M2 is operating in saturation, it's drain current is:

$$i_{d2} = (kZ_2/2)(V_{gsM2} - V_T)^2 \quad (5)$$

where $Z_2 = W2/L2$.

Substituting for $V_{gsM2}$:

$$i_{d2} = (kZ_2/2)(i_{ref}/V_{ref}kZ_2)^2 \quad (6)$$

The transconductance, $g_m$, of device M2 is therefore:

$$g_M = di_{d2}/dV_{gs} = kZ_2(V_{gsM2} - V_T) \quad (7)$$

$$g_m = kZ_2 i_{ref}/V_{ref} kZ_1$$

$$g_M = Z_2 i_{ref} / V_{ref}$$

The resulting transconductance is dependent only on $i_{ref}$, $V_{ref}$ and $Z_2/Z_1$, all well-defined quantities, independent of process, temperature, and power supply. The output reference current $IO_{ref}$ thus produced can be mirrored, and used to bias amplifier circuits which will also have constant $g_M$. The present bias technique has the benefit of producing stable gain-bandwidth in amplifiers using the disclosed bias circuits.

Figure 2:
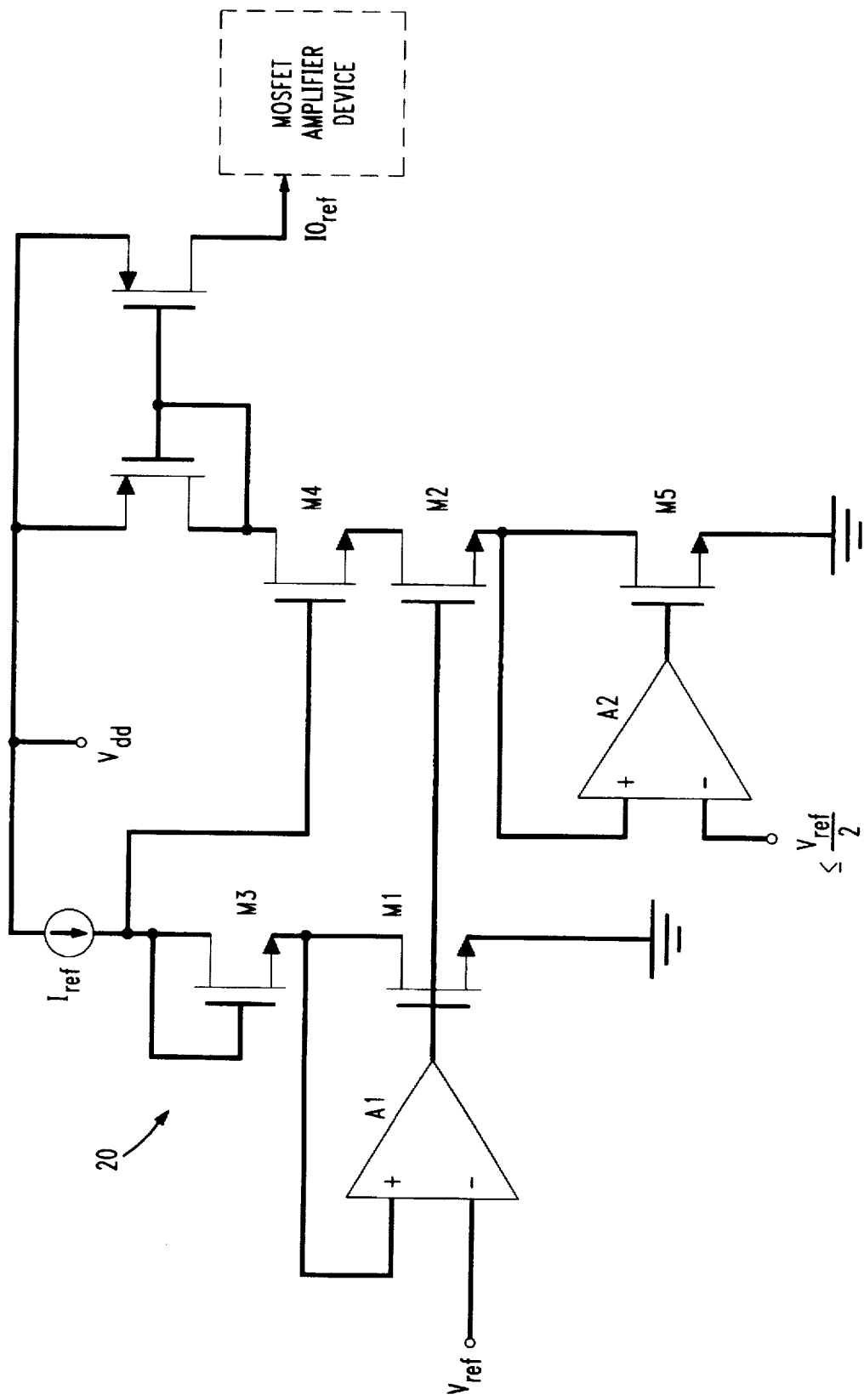
FIG. 2 is a schematic diagram of a second embodiment of a bias circuit, according to the invention.

Another embodiment of the invention, in which the voltage source $V_{ref}/2$ is replaced, is shown in the bias current circuit 20 in FIG. 2. Amplifiers A1 and A2 are operational amplifiers. Amplifier A1 maintains $V_{ds}$ of field effect device M1 at $V_{ds} = V_{ref}$. Amplifier A2 keeps the source voltage of saturated field effect device M2 at $V_s = V_{ref}/2$, assuming no body effect for the device M2. Alternatively, the source voltage of device M2 in FIG. 2 may be set to less than $V_{ref}/2$ to compensate for the body effect of device M2, which effect is process dependent. Typically, the gate-to-source terminal voltage of device M2 in FIG. 2 is reduced from the gate terminal voltage on device M1 by the biasing circuitry, by from about 20 to about 50 percent of $V_{ref}$, with the result that $$V_{gsM2} = (i_{ref}/V_{ref} kZ_1) + V_T$$

as in the circuit of FIG. 1. Note that $V_T$ is the threshold voltage of device M2, which voltage may be increased compared to the threshold voltage for device M1 due to the body effect of device M2. Field effect devices M3 and M4 are chosen to keep $V_{ds}$ of device M2 constant, and close to the pinch-off voltage of device M2 to reduce output conductance effects on the output reference current IOref.

The resulting constant transconductance bias current allows improved control of amplifier gain-bandwidth product, with process. This can significantly reduce variations of cut-off frequency of on-chip filters. For operational amplifiers, by producing a more-predictable gain-bandwidth, the amplifier compensation no longer has to over-compensate fast process cases in order to provide adequate compensation for slow process cases. This allows for improved gain-bandwidth of the amplifier.

Although the bias circuits shown in FIGS. 1 and 2 are implemented using N-channel field effect devices, it will be apparent that the circuits can be implemented using P-channel devices, in which case the voltages $V_{ref}$ and $V_{ref}/2$ are referenced to the supply voltage $V_{dd}$ rather than to ground.

While the foregoing description represents preferred embodiments of the invention, it will be obvious to those skilled in the art that various changes and modifications may be made, without departing from the true spirit and scope of the invention as pointed out in the following claims.

What I claim is:

1. A method of biasing an amplifier device to obtain a constant transconductance, comprising:

operating a first field effect device having source, drain and gate terminals in a triode operating region;

operating a second field effect device having source, drain and gate terminals in a saturation region;

deriving a source of a first reference voltage;

deriving a source of a first reference current;

biasing the first field effect device with first circuit means responsive to the first reference voltage so that a voltage level between the drain and the source terminals of the first field effect device is substantially equal to said first reference voltage while applying said first reference current to its drain terminal, and the first field effect device is biased in the triode operating region over a certain range of ambient operating conditions;

biasing the second field effect device with second circuit means to obtain a gate-to-source terminal voltage on said second device which voltage is derived from a voltage at the gate terminal of the first device and said first reference voltage, such that a second reference current flows into the drain terminal of the second field effect device, and the second field effect device is biased in the saturation region over said range of ambient operating conditions; and deriving an amplifier bias current for an amplifier device which is subject to said range of ambient operating conditions according to the second reference current in said second field effect device, for maintaining a substantially constant transconductance for the amplifier device over said range.

2. The method of claim 1, wherein said amplifier bias current deriving step includes mirroring of said second reference current.

3. The method of claim 1, including forming the amplifier device on a common substrate with said first and said second field effect devices, said first reference voltage source, and said first reference current source.

4. The method of claim 1, wherein said second field effect device biasing step includes subtracting a fraction of said first reference voltage from the voltage at the gate terminal of the first field effect device, and applying a remaining voltage to the gate terminal of the second field effect device.

5. The method of claim 1, wherein said second field effect device biasing step includes applying the voltage at the gate terminal of said first device to the gate terminal of the second field effect device, and applying a fraction of said reference voltage to the source terminal of the second device.

6. The method of claim 1, including reducing the voltage at the gate terminal of the first field effect device by from about 20 to about 50 percent of said reference voltage, and applying the reduced voltage between the gate and the source terminals of the second device.

7. An integrated circuit configuration in which the transconductance of an amplifier device is stabilized, comprising:

first field effect device means having source, drain and gate terminals for operation in a triode operating region;

second field effect device means having source, drain and gate terminals for operation in a saturation region;

means for producing a first reference voltage;

means for producing a first reference current, including means for applying the first reference current to the drain terminal of said first field effect device means;

first circuit means responsive to said first reference voltage, for biasing said first field effect device means so that its drain-to-source terminal voltage is substantially equal to said first reference voltage when said first reference current is applied to the drain terminal of the first device means and the first device means is biased in the triode operating region over a certain range of ambient operating conditions; and second circuit means for obtaining a gate-to-source terminal voltage on said second device means which voltage is derived from a gate terminal voltage of the first device means and said first reference voltage, for biasing said second device means so that a second reference current flows into the drain terminal of the second device means and the second device means is biased in the saturation region over said range of ambient operating conditions; and means for deriving an amplifier bias current for an amplifier device which is subject to said range of ambient operating conditions in accordance with said second reference current, wherein the transconductance of the amplifier device is maintained substantially constant over said range.

8. An integrated circuit configuration according to claim 7, including means for mirroring said second reference current, and means for applying the mirrored second reference current to said amplifier device.

9. An integrated circuit configuration according to claim 7, wherein said first and said second field effect device means, said first reference voltage producing means, and said first reference current producing means, are all formed on a common substrate.

10. An integrated circuit configuration according to claim 7, wherein said second circuit means includes means for subtracting a fraction of said first reference voltage from the voltage at the gate terminal of the first field effect device means, and means for applying a remaining voltage to the gate terminal of the second field effect device means.

11. An integrated circuit configuration according to claim 7, wherein said second circuit means includes means for applying the voltage at the gate terminal of said first field effect device means to the gate terminal of the second field effect device means, and means for applying a fraction of said first reference voltage to the source terminal of the second field effect device means.

12. An integrated circuit configuration according to claim 7, wherein said second circuit means includes means for reducing the voltage at the gate terminal of the first field effect device means by from about 20 to about 50 percent of said reference voltage, and means for applying the reduced voltage between the gate and the source terminals of said second field effect device means.

* * * * *